(12) United States Patent
Lee

(10) Patent No.: US 8,502,813 B2
(45) Date of Patent: Aug. 6, 2013

(54) SEMICONDUCTOR DEVICE INCLUDING LEVEL SHIFTER, DISPLAY DEVICE INCLUDING THE SEMICONDUCTOR DEVICE AND METHOD OF OPERATING THE SEMICONDUCTOR DEVICE

(75) Inventor: Woo-nyoung Lee, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 541 days.

(21) Appl. No.: 12/853,682

(22) Filed: Aug. 10, 2010

(65) Prior Publication Data

US 2011/0032242 A1 Feb. 10, 2011

(30) Foreign Application Priority Data

Aug. 10, 2009 (KR) .......................... 10-2009-0073525

(51) Int. Cl.
*G06F 3/038* (2006.01)
*G09G 5/00* (2006.01)

(52) U.S. Cl.
USPC .............. 345/212; 345/204; 345/98; 326/68; 326/81

(58) Field of Classification Search
None
See application file for complete search history.

(56) References Cited

U.S. PATENT DOCUMENTS

| 6,781,535 B2 * | 8/2004 | Lee | 341/144 |
| 2007/0200816 A1 * | 8/2007 | Taguchi | 345/100 |
| 2007/0229440 A1 * | 10/2007 | Yen | 345/100 |
| 2011/0090203 A1 * | 4/2011 | Cho | 345/211 |
| 2011/0096068 A1 * | 4/2011 | Choi et al. | 345/213 |

FOREIGN PATENT DOCUMENTS

| JP | 2007-232977 | 9/2007 |
| KR | 1020050081608 | 8/2005 |
| WO | 03/036606 | 5/2003 |

* cited by examiner

*Primary Examiner* — Jany Richardson
(74) *Attorney, Agent, or Firm* — F. Chau & Associates, LLC

(57) ABSTRACT

A semiconductor device includes a code generator and a level shifter. The code generator generates a code including one bit that is in a first logic state and at least one bit that is in a second logic state. The level shifter outputs signals that are at a first voltage level or at a second voltage level through a plurality of output terminals in response to the code. The level shifter includes a plurality of voltage controllers and a plurality of voltage converters. All but one of the voltage controllers control first signals output through all but one of the output terminals to be at the first voltage level in response to the at least one bit. One of the voltage converters controls a second signal output through the remaining output terminal to be at the second voltage level in response to the first signals.

20 Claims, 7 Drawing Sheets

| B1 | B2 | B3 | B4 | OUT_1 | OUT_2 | OUT_3 | OUT_4 | OUT_D |
|---|---|---|---|---|---|---|---|---|
| L | H | H | H | VDD | VSS | VSS | VSS | V1 |
| H | L | H | H | VSS | VDD | VSS | VSS | V2 |
| H | H | L | H | VSS | VSS | VDD | VSS | V3 |
| H | H | H | L | VSS | VSS | VSS | VDD | V4 |

| B1 | B2 | B3 | B4 | OUT_1 | OUT_2 | OUT_3 | OUT_4 | OUT_D |
|----|----|----|----|-------|-------|-------|-------|-------|
| H  | L  | L  | L  | VSS   | VDD   | VDD   | VDD   | V1    |
| L  | H  | L  | L  | VDD   | VSS   | VDD   | VDD   | V2    |
| L  | L  | H  | L  | VDD   | VDD   | VSS   | VDD   | V3    |
| L  | L  | L  | H  | VDD   | VDD   | VDD   | VSS   | V4    |

SEMICONDUCTOR DEVICE INCLUDING LEVEL SHIFTER, DISPLAY DEVICE INCLUDING THE SEMICONDUCTOR DEVICE AND METHOD OF OPERATING THE SEMICONDUCTOR DEVICE

CROSS-REFERENCE TO RELATED APPLICATIONS

This application priority to Korean Patent Application No. 10-2009-0073525, filed on Aug. 10, 2009, in the Korean Intellectual Property Office, the disclosure of which is incorporated by reference in its entirety herein.

BACKGROUND

1. Technical Field

Exemplary embodiments of the inventive concept relate to a semiconductor device, and more particularly to a semiconductor device including a level shifter, a display device including the semiconductor device, and a method of operating the semiconductor device.

2. Discussion of Related Art

A display driver can select a data voltage from among a plurality of data voltages by using an input signal, and output the selected data voltage to a display panel. The display panel may include a plurality of data lines, each receiving a corresponding one of the data voltages. A high voltage signal may be used as the input signal to select the data voltage for a respective one of the data lines. The display driver may only be supplied with a low voltage signal to conserve power. A level shifter may be used to convert the low voltage signal into the high voltage signal. However, display panels differ from one another, and each may require a different high voltage signal.

SUMMARY

A semiconductor device according to an exemplary embodiment of the inventive concept includes a code generator and level shifter. The code generator generates a code including one bit that is in a first logic state and at least one bit that is in a second logic state. The level shifter outputs signals that are at a first voltage level or at a second voltage level through a plurality of output terminals in response to the code. The level shifter may include a plurality of voltage controllers and a plurality of voltage converters. The plurality of voltage controllers control a signal output through a corresponding output terminal from among the plurality of output terminals of the level shifter, to be at the first voltage level when each of the voltage controllers is enabled in response to a corresponding bit from among the bits of the code. The plurality of voltage converters control a signal output through a corresponding output terminal from among the plurality of output terminals of the level shifter, to be at the second voltage level when each of the voltage converters is enabled in response to the remaining output signals of the level shifter.

Each of the voltage converters may operate complementarily with each of the voltage controllers which uses the output terminal of the level shifter jointly with each of the voltage converters.

Each of the voltage controllers may disconnect a first voltage source that applies a first voltage level from the corresponding output terminal of the level shifter in response to the bit that is in the first logic state, and output an output signal that is at the first voltage level by connecting the first voltage source to the corresponding output terminal of the level shifter in response to the bit that is in the second logic state.

When the remaining output signals are at the first voltage level, each of the voltage converters may output an output signal that is at the second voltage level by connecting a second voltage source that applies a second voltage level and the corresponding output terminal. When at least one output signal from among the remaining output signals of the level shifter is at the second voltage level, each of the voltage converters may disconnect the second voltage source from the corresponding output terminal of the level shifter. The semiconductor device may further include a decoder outputting one voltage from among a plurality of voltages in response to the output signals of the level shifter.

A semiconductor device according to an exemplary embodiment of the inventive concept includes a code generator and a level shifter. The code generator generates a code including one bit that is in a first logic state and at least one bit that is in a second logic state. The level shifter outputs signals that are at a first voltage level or at a second voltage level through a plurality of output terminals in response to the code. The level shifter includes a plurality of voltage controllers, where all but one of the voltage controllers control first signals output through all but one of the output terminals to be at the first voltage level in response to the at least one bit, and a plurality of voltage converters, where one of the voltage converters controls a second signal output through the remaining output terminal to be at the second voltage level in response to the first signals.

The remaining voltage controller may disconnect a first voltage source that applies the first voltage level to the remaining output terminal in response to the bit that is in the first logic state, and the all but one voltage controllers may output the first signals at the first voltage level by connecting the first voltage source to the all but one output terminals in response to the at least one bit that is in the second logic state. The one voltage converter may output the second signal that is at the second voltage level by connecting a second voltage source that applies the second voltage level to the remaining output terminal in response to the first signals, and the all but one voltage converters may disconnect the second voltage source from the all but one output terminals in response to the second signal.

A display device according to an exemplary embodiment of the inventive concept includes a display panel including a plurality of pixel regions, a source driver, a decoder, a gate driver, and a controller. The source driver includes a code generator and a level shifter. The code generator generates a code including one bit that is in a first logic state and at least one other bit that is in a second and different logic state. The level shifter includes a plurality of output terminals. The level shifter is configured to output a second signal at a second voltage level through one of the output terminals and first signals at a first and different voltage level through the other output terminals in response to the code. The decoder outputs one voltage from among a plurality of voltages in response to output signals of the output terminals. The source driver drives source lines of the display panel in response to the one voltage output from the decoder. The gate driver drives gate lines of the display panel. The controller controls the source driver and the gate driver.

The level shifter may include a plurality of voltage controllers, each receiving a distinct one of the bits of the code, and enabled by the received bit in the second logic state to output the first signals to the other output terminals, and a plurality of voltage converters, wherein one of the voltage converters is enabled by the first signals to output the second signal to the one output terminal. One of the voltage controllers may be disabled by the bit in the first logic state, thereby preventing the voltage controller from applying a signal at the second voltage level to the one output terminal. The other voltage converters may be disabled by the second signal, thereby preventing the other voltage converters from applying signals at the first voltage level to the other output terminals.

Each of the voltage controllers may be connected between a first voltage source providing the first voltage level and a distinct one of the output terminals, where a path from the first voltage source through each voltage controller to its corresponding output terminal is disconnected when the corresponding received bit is in the first logic state and connected when the received bit is in the second logic state. Each of the voltage converters may be connected between a second voltage source providing the second voltage level and a distinct one of the output terminals, where a path from the second voltage source through each voltage converter to its corresponding output terminal is disconnected by the second signal and connected by the first signals.

A method of operating a semiconductor device including a level shifter according to an exemplary embodiment of the inventive concept includes receiving a code including one bit that is in a first logic state and at least one bit that is in a second logic state, controlling a signal output through a corresponding output terminal from among a plurality of output terminals of the level shifter, to be at a first voltage level in response to the bit that is in the second logic state, and controlling a signal output through a corresponding output terminal from among the plurality of output terminals of the level shifter, to be at a second voltage level in response to the bit that is in the first logic state and the remaining output signals output from the level shifter.

A method of operating a semiconductor device including a level shifter according to an exemplary embodiment of the inventive concept includes receiving a code comprising one bit that is in a first logic state and at least one bit that is in a second logic state, controlling first signals output through all but one of a plurality of output terminals of the level shifter, to be at a first voltage level in response to the bit that is in the second logic state, and controlling a second signal output through the remaining output terminal of the level shifter, to be at a second voltage level in response to the bit that is in the first logic state and the first signals.

Controlling the first signals may include enabling all but one of a plurality of voltage controllers in response to the bit in the second logic state to supply the first signals at the first voltage level to the all but one output terminals, and disabling the remaining voltage controller in response to the bit in the first logic state to prevent supply of a signal at the first voltage level to the remaining output terminal. Controlling the second signal may include enabling a voltage converter of a plurality of voltage converters in response to the first signals to supply the second signal at the second voltage level to the remaining output terminal, and disabling the remaining voltage converters in response to the second signal to prevent supply of signals at the second voltage level to the all but one output terminals.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF EXEMPLARY EMBODIMENTS

Figure 1:
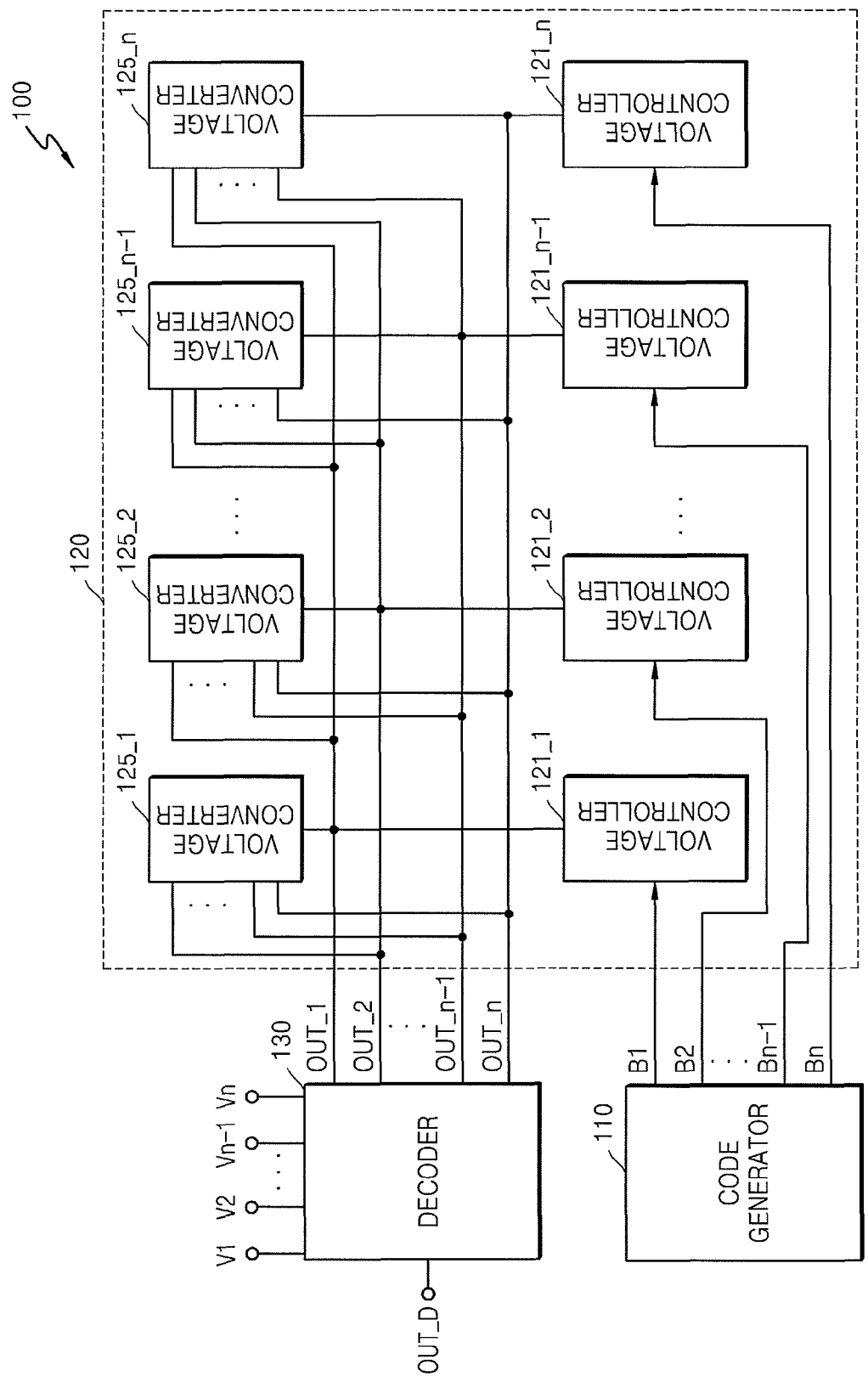
FIG. 1 is a schematic block diagram of a semiconductor device according to an exemplary embodiment of the inventive concept.

Hereinafter, the inventive concept will be described in detail by explaining exemplary embodiments of the inventive concept with reference to the attached drawings. Like reference numerals in the drawings denote like elements.

FIG. 1 is a schematic block diagram of a semiconductor device 100 according to an exemplary embodiment of the inventive concept. Referring to FIG. 1, the semiconductor device 100 includes a code generator 110 and a level shifter 120.

The code generator 110 generates a code including first through n-th (where n is a positive integer) bits B1 through Bn, and outputs the generated code to the level shifter 120. The first bit B1 is in a first logic state and the second through n-th bits B2 through Bn are in a second logic state. For example, the first logic state may be a logic low state, and the second logic state may a logic high state, or vice versa. The level shifter 120 outputs output signals that are at a first voltage level or at a second voltage level to first through n-th output terminals OUT_1 through OUT_n in response to the received code. The level shifter 120 includes first through n-th voltage controllers 121_1 through 121_n and first through n-th voltage converters 125_1 through 125_n, which operate complementarily.

Hereinafter, for convenience of explanation, the operation of the semiconductor device 100 will be described based on the assumption that the level shifter 120 is a radix-4 level shifter. However, embodiments of the inventive concept are not limited thereto, as the level shifter 120 may be implemented as a radix-n level shifter, as illustrated in FIG. 1. In other words, when the radix-n level shifter is used, the code generator 110 may generate a code including n bits, and the level shifter 120 may include n voltage controllers and n voltage converters. For example, the variable n may correspond to a number less than 4 or greater than 4.

Figure 2:
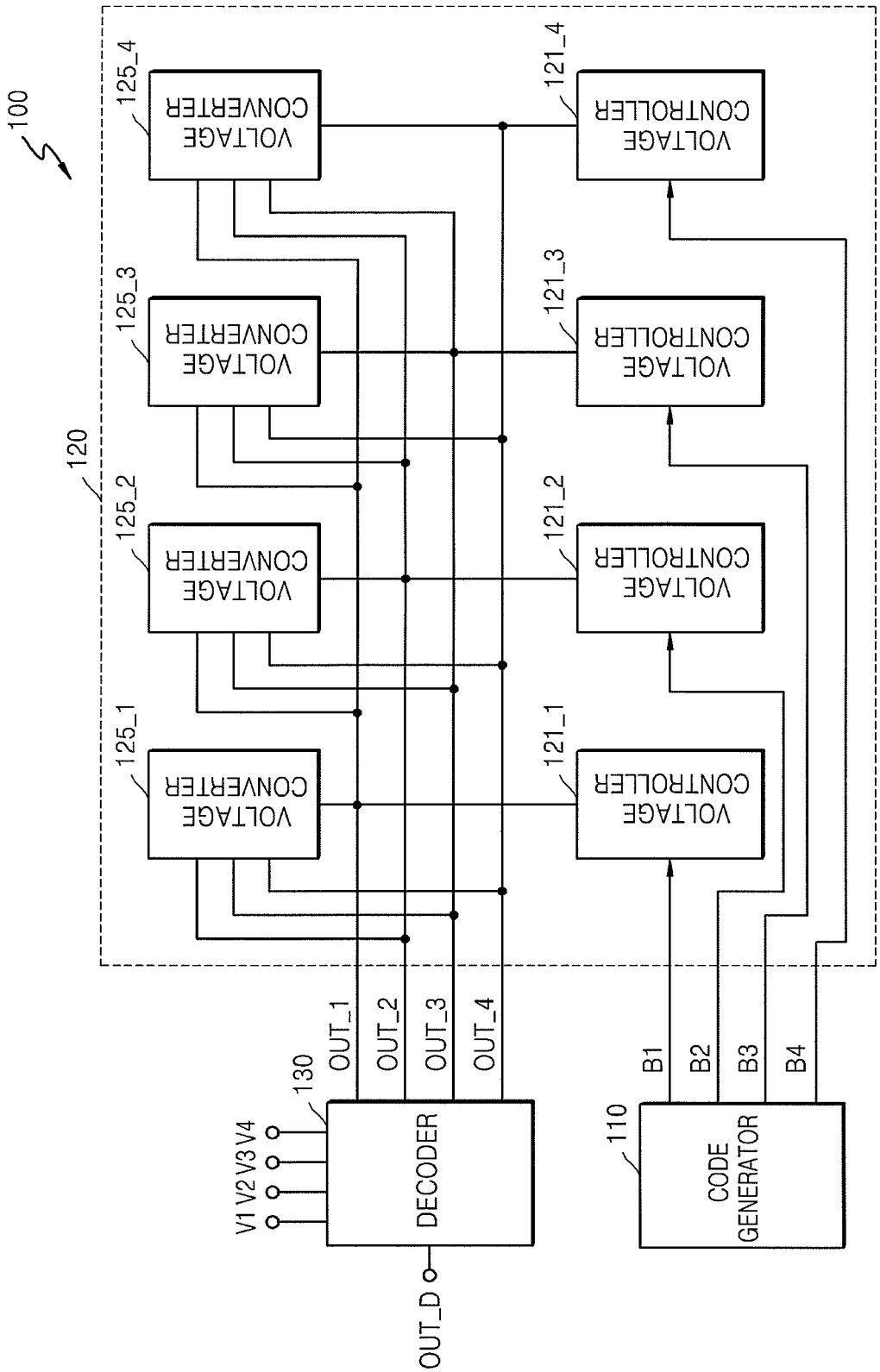
FIG. 2 is a schematic block diagram of the semiconductor device of FIG. 1, according to an exemplary embodiment of the inventive concept.

FIG. 2 is a schematic block diagram of the semiconductor device 100 of FIG. 1, according to an exemplary embodiment of the inventive concept. Referring to FIG. 2, the code generator 110 generates and outputs a code including first through fourth bits B1, B2, B3, and B4. The following example assumes that the first bit B1 is in a first logic state and the second through fourth bits B2, B3, and B4 are in a second and different logic state.

The level shifter 120 includes first through fourth voltage controllers 121_1, 121_2, 121_3, and 121_4 and first through fourth voltage converters 125_1, 125_2, 125_3, and 125_4. All but one of the first through fourth voltage controllers 121_1, 121_2, 121_3, and 121_4 is enabled in response to a bit of the code being set to one of two states and the remaining voltage controller is disabled in response at least one of the other bits of the code being set to the other of the two states. The enabled voltage controllers output signals to respective output terminals at first voltage level (e.g., a ground voltage) and the disabled voltage controller is prevented from outputting a signal to the remaining output terminal at the first voltage level.

For example, the first voltage controller 121_1 is disabled in response to the first bit B1 being in the first logic state, and the second through fourth voltage controllers 121_2, 121_3, and 121_4 are enabled in response to bits B2, B3, and B4 being in the second logic state, respectively. Since the second voltage controller 121_2 is enabled in response to the second bit B2 being in the second logic state, the second voltage controller 121_2 outputs a signal at the first voltage level to the second output terminal OUT_2. Likewise, the third voltage controller 121_3 and the fourth voltage controller 121_4 are enabled in response to the third bit B3 and the fourth bit B4 being in the second logic state, respectively. Thus, the third and fourth voltage controllers 121_3 and 121_4 both output signals at the first voltage level to the third output terminal OUT_3 and the fourth output terminal OUT_4, respectively. Since the first voltage controller 121_1 is disabled, it is prevented from outputting a signal at the first voltage level to the first output terminal OUT_1.

The first voltage controller 121_1 being disabled and the other voltage controllers 121_2, 121_3, and 121_4 being enabled is merely an example. For example, if the first, third, and fourth bits B1, B3, B4 are set to the second logic state and the second bit B2 is set to the first logic state, the first, third, and fourth voltage controllers 121_1, 121_3, and 121_4 would be disabled and the second voltage controller 121_2 would be enabled. Further, if all the bits B1-B4 are set to the second logic state, then all of the voltage controllers would be disabled. The first voltage level could be a voltage that is sufficient to enable a transistor.

Each of the voltage controllers 121_1-4 is connected to a distinct one of the voltage converters 125_1-4 and to a distinct one of the output terminals (e.g., referred to as a driving output terminal). For example, the first voltage controller 121_1 is connected to voltage converter 125_1 and (e.g., driving) output terminal OUT_1, the second voltage controller is connected to voltage converter 125_2 and (e.g., driving) output terminal OUT_2, the third voltage controller is connected to voltage converter 125_3 and (e.g., driving) output terminal OUT_3, and the fourth controller is connected to voltage converter 125_4 and (e.g., driving) output terminal OUT_4.

Each of the voltage converters 125_1-4 is also connected to the remaining output terminals. For example, the first voltage converter 125_1 is connected to output terminals OUT_2-4, the second voltage converter 125_2 is connected to output terminals OUT_1, and OUT_3-4, the third voltage converter 125_3 is connected to output terminals OUT_1-2, and OUT_4, and the fourth voltage converter 125_4 is connected to output terminals OUT_1-3.

Voltages of the remaining output terminals connected to a voltage converter are used to control that voltage converter (e.g., referred to as control voltages). For example, the first voltage converter 125_1 is controlled by voltages of output terminals OUT_2-4, the second voltage converter 125_2 is controlled by voltages of output terminals OUT_1, and OUT_3-4, the third voltage converter 125_3 is controlled by voltages of output terminals OUT_1-2 and OUT_4, and the fourth voltage converter 125_4 is controlled by voltages of output terminals OUT_1-3.

For example, when the control voltages applied to a voltage converter are all set to the first voltage level, the voltage converter may be considered enabled and applies a voltage of a second voltage level to its driving output terminal. For example, when the voltages of output terminals OUT_2-4 are all the first voltage level, the first voltage converter 125_1 applies a voltage of the second voltage level to output terminal OUT_1. However, when one of the control voltages applied to a voltage converter is not set to the first voltage level, the voltage converter is disabled. For example, application of the second voltage level by the first voltage converter 125_1 to the output terminal OUT_1 causes one of the control voltages of each the other voltage converters 125_2-4 to be set to the second voltage level, thereby disabling voltage converters 125_2-4. A disabled voltage converter is prevented from applying a signal of the second voltage level to the remaining output terminals. For example, when voltage converters 125_2-4 are disabled, they are prevented from applying a voltage of a second voltage level to output terminals OUT2-4. The second voltage level may be greater than the first voltage level and may be a level of a power supply voltage, for example.

While the first voltage converter 125_1 is described as being disabled and the second through fourth voltage converters 125_2-4 are described as being enabled, embodiments of the inventive concept are not limited thereto. For example, the control voltages all set to the first voltage level could be applied to enable any one of the other voltage converters. Further, all of the voltage converters could be disabled, if one of the applied control voltages is set to the second voltage level.

The level shifter 120 according to an exemplary embodiment of the inventive concept will now be described in greater detail with reference to FIGS. 3 through 6.

The semiconductor device 100 of FIG. 1 or 2 may further include a decoder 130. The decoder 130 selects one voltage from among a plurality of voltages in response to the signals output from the first through fourth output terminals OUT_1, OUT_2, OUT_3, and OUT_4 of the level shifter 120 and outputs the selected voltage. In FIG. 2, four output signals are output from the first through fourth output terminals OUT_1, OUT_2, OUT_3, and OUT_4, respectively. Thus, the decoder 130 selects one voltage from among the first through fourth voltages V1, V2, V3, and V4 and outputs the selected voltage. However, embodiments of the inventive concept are not limited to four output signals and voltages. For example, when the radix-n level shifter is used, as illustrated in FIG. 1, the decoder 130 selects one voltage from among n voltages and outputs the selected voltage. Alternatively, when a plurality of level shifters, each as the level shifter 120 described above, are used, the decoder 130 selects one voltage from among voltages whose number corresponds to the number of output signals output from the plurality of level shifters in response to the output signals.

Figure 3:
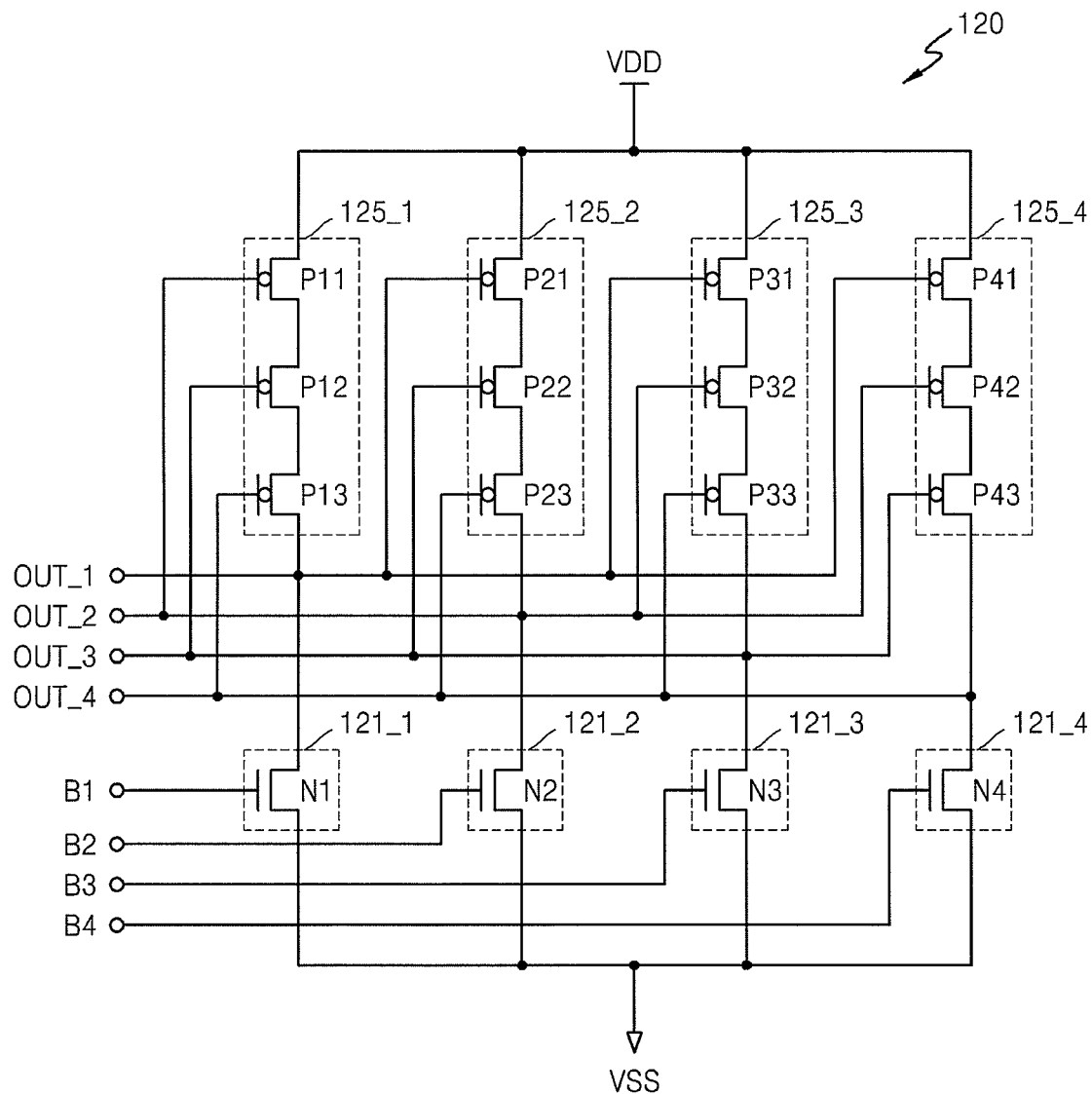
FIG. 3 is a circuit diagram of a level shifter of the semiconductor device of FIG. 2, according to an exemplary embodiment of the inventive concept.

FIG. 3 is a circuit diagram of the level shifter 120 of the semiconductor device 100 of FIG. 2, according to an exemplary embodiment of the inventive concept. Referring to FIGS. 2 and 3, each of the first through fourth voltage controllers 121_1, 121_2, 121_3, and 121_4 may be an NMOS transistor including a gate to which a corresponding bit from among the first through fourth bits B1, B2, B3, and B4 is applied, a first terminal connected to a corresponding output terminal from among the first through fourth output terminals OUT_1, OUT_2, OUT_3, and OUT_4, and a second terminal connected to a first voltage source that applies a first voltage level VSS. For example, the first voltage controller 121_1 may be a first NMOS transistor N1 including a gate to which the first bit B1 is applied, a first terminal connected to the first output terminal OUT_1, and a second terminal connected to the first voltage source. The second voltage controller 121_2 may be a second NMOS transistor N2 including a gate to which the second bit B2 is applied, a first terminal connected to the second output terminal OUT_2, and a second terminal connected to the first voltage source. The third voltage controller 121_3 may be a third NMOS transistor N3 including a gate to which the third bit B3 is applied, a first terminal connected to the third output terminal OUT_3, and a second terminal connected to the first voltage source. The fourth voltage controller 121_4 may be a fourth NMOS transistor N4 including a gate to which the fourth bit B4 is applied, a first terminal connected to the fourth output terminal OUT_4, and a second terminal connected to the first voltage source.

While FIG. 3 illustrates that each of the first through fourth voltage controllers 121_1, 121_2, 121_3, and 121_4 are NMOS transistors, embodiments of the inventive concept is not limited thereto. For example, if the code generator 110 of FIG. 1 generates and outputs the first through fourth bits B1, B2, B3, and B4 that are in opposite logic states to the logic states described above, each of the first through fourth voltage controllers 121_1, 121_2, 121_3, and 121_4 may be replaced with PMOS transistors.

Each of the first through fourth voltage converters 125_1, 125_2, 125_3, and 125_4 may include a plurality of transistors each including a gate to which a respective one of the control voltages is applied. For example, the voltage controller of a corresponding voltage converter is connected to one of the output terminals, (e.g., the driving output terminal) and a distinct one of the voltages of the remaining output terminals (e.g., the control voltages) is applied to a gate of a different transistor of the voltage converter. The transistors of each of the first through fourth voltage converters 125_1, 125_2, 125_3, and 125_4 are serially connected to one another between a second voltage source VDD and a corresponding output terminal from among the plurality of output terminals OUT_1, OUT_2, OUT_3, and OUT_4 of the level shifter 120.

Each of the first through fourth voltage converters 125_1, 125_2, 125_3, and 125_4 may include a number transistors corresponding to the remaining number of output terminals of the level shifter 120.

For example, the first voltage converter 125_1 may include first through third PMOS transistors P11, P12, and P13. The first PMOS transistor P11 includes a gate to which a signal output through the second output terminal OUT_2 is applied and a first terminal connected to the second voltage source. The second PMOS transistor P12 includes a gate to which a signal output through the third output terminal OUT_3 is applied and a first terminal connected to a second terminal of the first PMOS transistor P11. The third PMOS transistor P13 includes a gate to which a signal output through the fourth output terminal OUT_4 is applied, a first terminal connected to a second terminal of the second PMOS transistor P12, and a second terminal connected to the first output terminal OUT_1.

The second voltage converter 125_2 may include fourth through sixth PMOS transistors P21, P22, and P23. The fourth PMOS transistor P21 includes a gate to which a signal output through the first output terminal OUT_1 is applied and a first terminal connected to the second voltage source. The fifth PMOS transistor P22 includes a gate to which a signal output through the third output terminal OUT_3 is applied and a first terminal connected to a second terminal of the fourth PMOS transistor P21. The sixth PMOS transistor P23 includes a gate to which a signal output through the fourth output terminal OUT_4 is applied, a first terminal connected to a second terminal of the fifth PMOS transistor P22, and a second terminal connected to the second output terminal OUT_2.

The third voltage converter 125_3 may include seventh through ninth PMOS transistors P31, P32, and P33. The seventh PMOS transistor P31 includes a gate to which the signal output through the first output terminal OUT_1 is applied and a first terminal connected to the second voltage source. The eighth PMOS transistor P32 includes a gate to which a signal output through the second output terminal OUT_2 is applied and a first terminal connected to a second terminal of the seventh PMOS transistor P31. The ninth PMOS transistor P33 includes a gate to which the signal output through the fourth output terminal OUT_4 is applied, a first terminal connected to a second terminal of the eighth PMOS transistor P32, and a second terminal connected to the third output terminal OUT_3.

The fourth voltage converter 125_4 may include tenth through twelfth PMOS transistors P41, P42, and P43. The tenth PMOS transistor P41 includes a gate to which the signal output through the first output terminal OUT_1 is applied and a first terminal connected to the second voltage source. The eleventh PMOS transistor P42 includes a gate to which the signal output through the second output terminal OUT_2 is applied and a first terminal connected to a second terminal of the tenth PMOS transistor P41. The twelfth PMOS transistor P43 includes a gate to which the signal output through the third output terminal OUT_3 is applied, a first terminal connected to a second terminal of the eleventh PMOS transistor P42, and a second terminal connected to the fourth output terminal OUT_4.

Figures 4, 5:
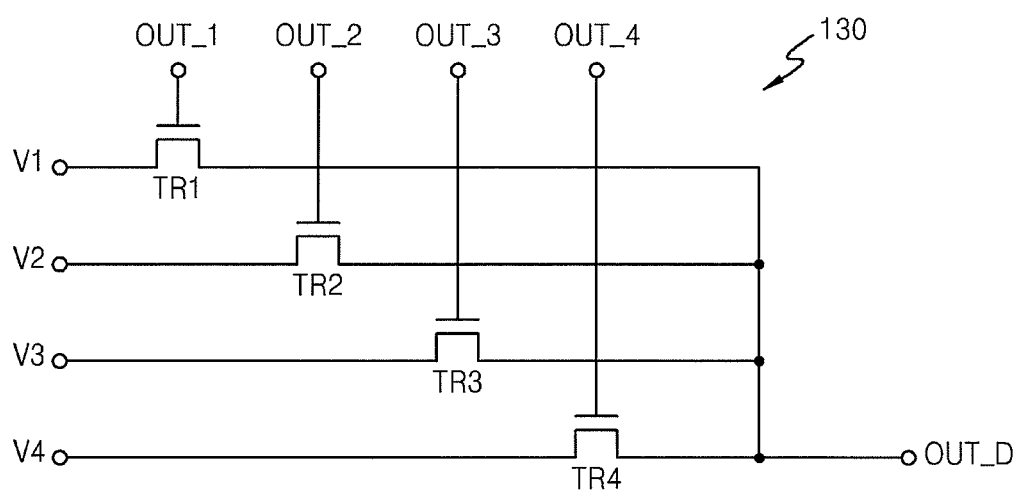
FIG. 4 is a circuit diagram of a decoder of the semiconductor device of FIG. 2, according to an exemplary embodiment of the inventive concept.
FIG. 5 is a table showing exemplary logic states of signals of the semiconductor device of FIG. 2, including the level shifter of FIG. 3 and the decoder of FIG. 4.

FIG. 4 is a circuit diagram of the decoder 130 of the semiconductor device 100 of FIG. 2, according to an exemplary embodiment of the inventive concept. Referring to FIGS. 2 through 4, the decoder 130 may include first through fourth transistors TR1, TR2, TR3, and TR4. Although FIG. 1 is illustrated with 4 transistors, embodiments of the present invention are not limited thereto. For example, when one voltage is selected from among n voltages, as described with reference to FIG. 1, the decoder 130 may include n transistors.

A gate of the first transistor TR1 is connected to the first output terminal OUT_1, and the first voltage V1 is applied to a first terminal of the first transistor TR1, and a second terminal of the first transistor TR1 is connected to an output terminal OUT_D of the decoder 130. A gate of the second transistor TR2 is connected to the second output terminal OUT_2, and the second voltage V2 is applied to a first terminal of the second transistor TR2, and a second terminal of the second transistor TR2 is connected to the output terminal OUT_D of the decoder 130. A gate of the third transistor TR3 is connected to the third output terminal OUT_3, and the third voltage V3 is applied to a first terminal of the third transistor TR3, and a second terminal of the third transistor TR3 is connected to the output terminal OUT_D of the decoder 130. A gate of the fourth transistor TR4 is connected to the fourth output terminal OUT_4, and the fourth voltage V4 is applied to a first terminal of the fourth transistor TR4, and a second terminal of the fourth transistor TR4 is connected to the output terminal OUT_D of the decoder 130. While FIG. 4 illustrates the first through fourth transistors TR1, TR2, TR3, and TR4 as NMOS transistors, embodiments of the inventive concept are not limited thereto. For example, if transistors complimentary to those shown in FIG. 3 are used, the first through fourth transistors TR1, TR2, TR3, and TR4 could be replaced with PMOS transistors.

FIG. 5 is a table showing exemplary logic states of signals of the semiconductor device 100 of FIG. 2, including the level shifter 120 of FIG. 3 and the decoder 130 of FIG. 4. Hereinafter, the operation of the semiconductor device 100 of FIG. 2, including the level shifter 120 of FIG. 3 and the decoder 130 of FIG. 4, will be described with reference to FIGS. 2 through 5.

An example where the first bit B1 is in a first logic state L and the second through fourth bits B2, B3, and B4 are in a second logic state H will be described below. Since the first bit B1 is in the first logic state L, a first NMOS transistor N1 is turned off. Since the second through fourth bits B2, B3, and B4 are in the second logic state H, the second through fourth NMOS transistors N2, N3, and N4 are turned on, and signals output from the second through fourth output terminals OUT_2, OUT_3, and OUT_4 are at the first voltage level VSS. Since the signals output from the second through fourth output terminals OUT_2, OUT_3, and OUT_4 are at the first voltage level VSS, all of the first through third PMOS transistors P11, P12, and P13 of the first voltage converter 125_1 are turned on so that the signal output from the first output terminal OUT_1 may be at the second voltage level VDD. Since the signal output from the first output terminal OUT_1 is at the second voltage level VDD, all of the fourth, seventh, and tenth PMOS transistors P21, P31, and P41 are turned off. Thus, the second through fourth voltage converters 125_2, 125_3, and 125_4 are disabled so that the signals output from the second through fourth output terminals OUT_2, OUT_3, and OUT_4 may be maintained at the first voltage level VSS.

As a result, the first transistor TR1 of the decoder 130 is turned on, and the second through fourth transistors TR2, TR3, and TR4 of the decoder 130 are turned off, and the decoder 130 outputs the first voltage V1 to its output terminal OUT_D.

Next, an example where the second bit B2 is in the first logic state L and the first, third, and fourth bits B2, B3, and B4 are in the second logic state H will be described below. In this example, the second NMOS transistor N2 is turned off, and the first, third, and fourth NMOS transistors N1, N3, and N4 are turned on so that the signals output from the first, third, and fourth output terminals OUT_1, OUT_3, and OUT_4 may be at the first voltage level VSS. Also, since the fourth through sixth PMOS transistors P21, P22, and P23 are turned on in response to the signals output from the first, third, and fourth output terminals OUT_1, OUT_3, and OUT_4, the signal output from the second output terminal OUT_2 is at the second voltage level VDD. Since the first, eighth, and eleventh PMOS transistors P11, P32, and P42 are turned off in response to the signal output from the second output terminal OUT_2, the first, third, and fourth voltage converters 125_1, 125_3, and 125_4 are disabled. Thus, the second transistor TR2 of the decoder 130 is turned on, and the first, third, and fourth transistors TR1, TR3, and TR4 of the decoder 130 are turned off so that the decoder 130 may output the second voltage V2 to the output terminal OUT_D.

The above-described operation of the semiconductor device 100 of FIG. 2, including the level shifter 120 of FIG. 3 and the decoder 130 of FIG. 4, is performed in a similar manner in other examples where only the third bit B3 is in the first logic state L or only the fourth bit B4 is in the first logic state L. Thus, detailed descriptions thereof need not be provided.

According to an exemplary embodiment of the inventive concept as described above, when the code generator 110 generates and outputs a code having a bit with a first logic state and the other bits with a different second logic state, the level shifter 120 outputs only one output signal at the second voltage level VDD in response to the code so that the decoder 130 may select one voltage from among a plurality of voltages and output the selected voltage.

Figure 6:
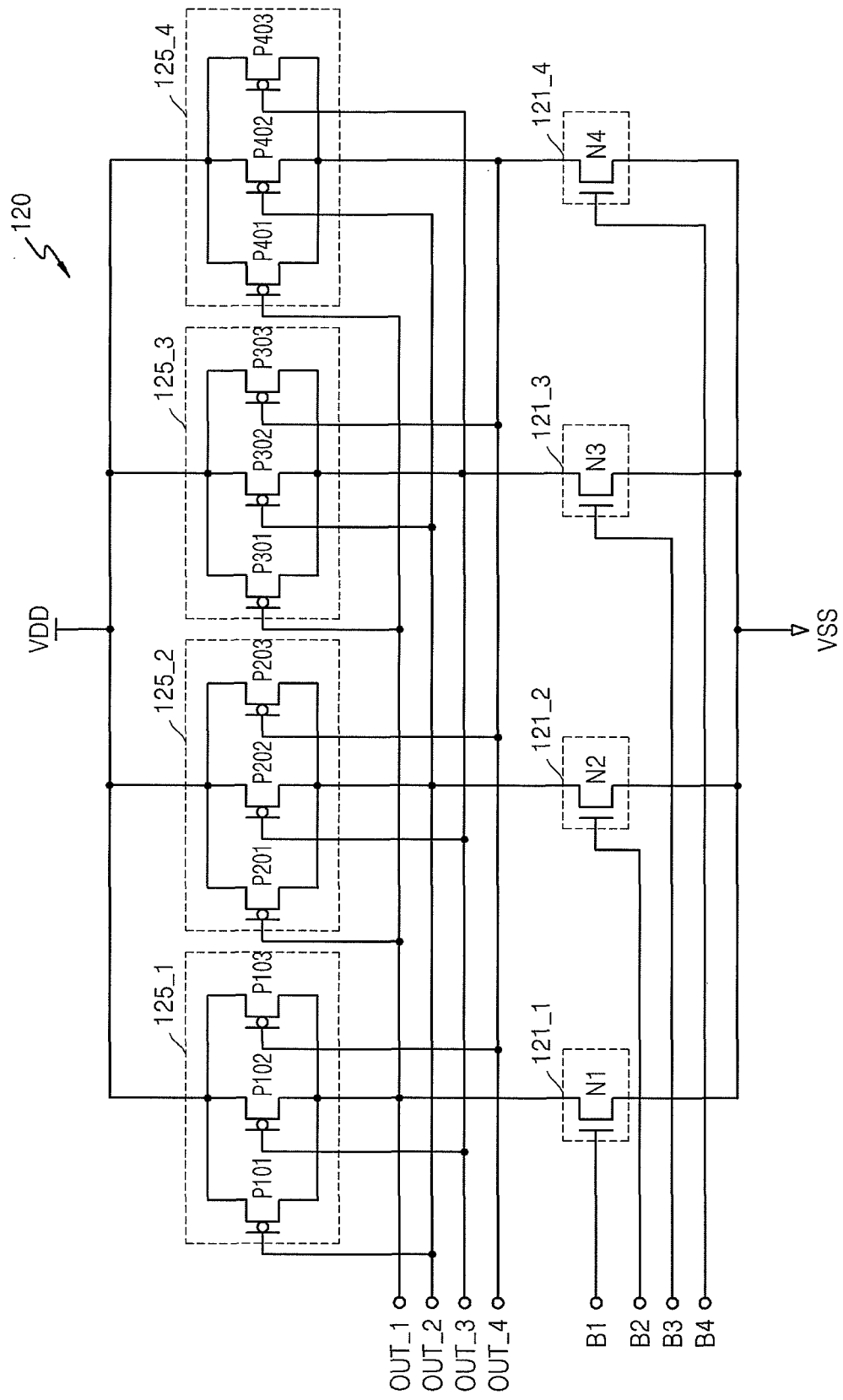
FIG. 6 is a circuit diagram of the level shifter of the semiconductor device of FIG. 2, according to an exemplary embodiment of the inventive concept.

FIG. 6 is a circuit diagram of the level shifter 120 of the semiconductor device 100 of FIG. 2, according to an exemplary embodiment of the inventive concept. Referring to FIGS. 2 and 6, first through fourth voltage controllers 121_1, 121_2, 121_3, and 121_4 may be first through fourth NMOS transistors N1, N2, N3, and N4. Each of the first through fourth NMOS transistors N1, N2, N3, and N4 include a gate to which a bit selected from among first through fourth bits B1, B2, B3, and B4 is applied, a first terminal connected to an output terminal selected from among first through fourth output terminals OUT_1, OUT_2, OUT_3, and OUT_4, and a second terminal connected to a first voltage source that applies a first voltage level VSS. The first through fourth voltage controllers 121_1, 121_2, 121_3, and 121_4 of FIG. 6 have the same structure as those of the first through fourth voltage controllers 121_1, 121_2, 121_3, and 121_4 of FIG. 3 and thus detailed descriptions thereof need not be provided. Also, when the first through fourth bits B1, B2, B3, and B4 of the code generated by the code generator 110 of FIG. 2, as described above with reference to FIG. 3, are in opposite logic states to the logic states described above, each of the first through fourth voltage controllers 121_1, 121_2, 121_3, and 121_4 may be replaced with a PMOS transistor.

Each of the first through fourth voltage converters 125_1, 125_2, 125_3, and 125_4 may include a plurality of transistors each including a gate to which a corresponding output signal from among the remaining output signals of the level shifter 120 is applied. The transistors of each of the first through fourth voltage converters 125_1, 125_2, 125_3, and 125_4 are connected to one another in parallel between a second voltage source for applying a second voltage level VDD and a corresponding output terminal from among the plurality of output terminals OUT_1, OUT_2, OUT_3, and OUT_4 of the level shifter 120. Each of the first through fourth voltage converters 125_1, 125_2, 125_3, and 125_4 may include a number of transistors corresponding to the number of the remaining output terminals of the level shifter 120.

For example, the first voltage converter 125_1 may include first through third PMOS transistors P101, P102, and P103. The first PMOS transistor P101 includes a gate to which a signal output through the second output terminal OUT_2 is applied, a first terminal connected to the second voltage source, and a second terminal connected to the first output terminal OUT_1. The second PMOS transistor P102 includes a gate to which a signal output through the third output terminal OUT_3 is applied, a first terminal connected to the second voltage source, and a second terminal connected to the first output terminal OUT_1. The third PMOS transistor P103 includes a gate to which a signal output through the fourth output terminal OUT_4 is applied, a first terminal connected to the second voltage source, and a second terminal connected to the first output terminal OUT_1.

The second voltage converter 125_2 may include fourth through sixth PMOS transistors P201, P202, and P203. The fourth PMOS transistor P201 includes a gate to which a signal output through the first output terminal OUT_1 is applied, a first terminal connected to the second voltage source, and a second terminal connected to the second output terminal OUT_2. The fifth PMOS transistor P202 includes a gate to which a signal output through the third output terminal OUT_3 is applied, a first terminal connected to the second voltage source, and a second terminal connected to the second output terminal OUT_2. The sixth PMOS transistor P203 includes a gate to which a signal output through the fourth output terminal OUT_4 is applied, a first terminal connected to the second voltage source, and a second terminal connected to the second output terminal OUT_2.

The third voltage converter 125_3 may include seventh through ninth PMOS transistors P301, P302, and P303. The seventh PMOS transistor P301 includes a gate to which the signal output through the first output terminal OUT_1 is applied, a first terminal connected to the second voltage source, and a second terminal connected to the third output terminal OUT_3. The eighth PMOS transistor P302 includes a gate to which a signal output through the second output terminal OUT_2 is applied, a first terminal connected to the second voltage source, and a second terminal connected to the third output terminal OUT_3. The ninth PMOS transistor P303 includes a gate to which the signal output through the fourth output terminal OUT_4 is applied, a first terminal connected to the second voltage source, and a second terminal connected to the third output terminal OUT_3.

The fourth voltage converter 125_4 may include tenth through twelfth PMOS transistors P401, P402, and P403. The tenth PMOS transistor P401 includes a gate to which the signal output through the first output terminal OUT_1 is applied, a first terminal connected to the second voltage source, and a second terminal connected to the fourth output terminal OUT_4. The eleventh PMOS transistor P402 includes a gate to which the signal output through the second output terminal OUT_2 is applied, a first terminal connected to the second voltage source, and a second terminal connected to the fourth output terminal OUT_4. The twelfth PMOS transistor P403 includes a gate to which the signal output through the third output terminal OUT_3 is applied, a first terminal connected to the second voltage source, and a second terminal connected to the fourth output terminal OUT_4.

Figures 7, 8:
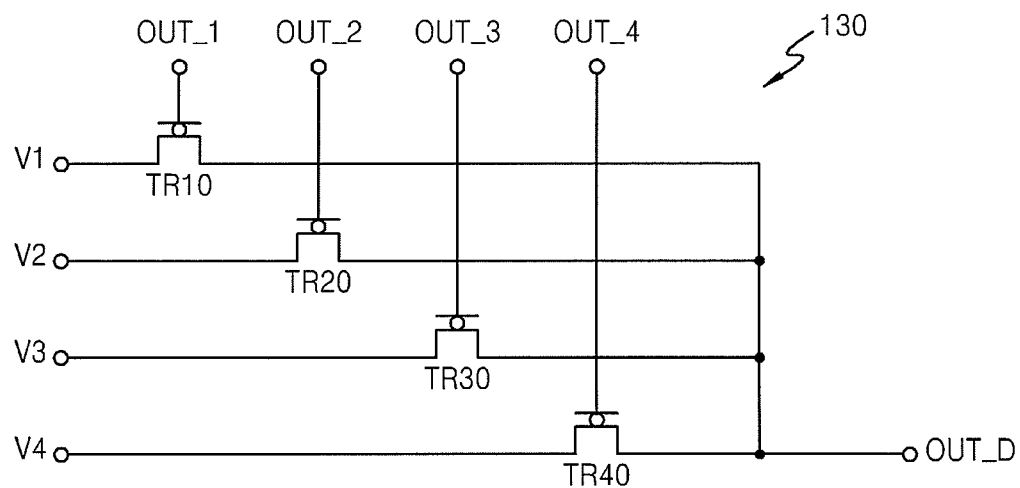
FIG. 7 is a circuit diagram of the decoder of the semiconductor device of FIG. 2, according to an exemplary embodiment of the inventive concept.
FIG. 8 is a table showing exemplary logic states of signals of the semiconductor device of FIG. 2 including the level shifter of FIG. 6 and the decoder of FIG. 7.

FIG. 7 is a circuit diagram of the decoder 130 of the semiconductor device 100 of FIG. 2, according to an exemplary embodiment of the inventive concept. Referring to FIGS. 2, 6, and 7, the decoder 130 may include first through fourth transistors TR10, TR20, TR30, and TR40. Although FIG. 7 illustrates 4 transistors, exemplary embodiments of the invention concept are not limited thereto. For example, when one voltage is selected from among n voltages, as described with reference to FIG. 1, the decoder 130 may include n transistors.

The decoder 130 of FIG. 7 may be formed by replacing the first through fourth transistors TR1, TR2, TR3, and TR4 of FIG. 4 with PMOS transistors. The first through fourth transistors TR10, TR20, TR30, and TR40 of FIG. 7 are connected to one another in the same manner as that in which the first through fourth transistors TR1, TR2, TR3, and TR4 of FIG. 4 are connected to one another, and a thus, detailed descriptions thereof need not be provided.

FIG. 8 is a table showing exemplary logic states of signals of the semiconductor device 100 of FIG. 2, including the level shifter 120 of FIG. 6 and the decoder 130 of FIG. 7. Hereinafter, the operation of the semiconductor device 100 of FIG. 2, including the level shifter 120 of FIG. 6 and the decoder 130 of FIG. 7, will be described with reference to FIGS. 2, and 6 through 8.

An example where the first bit B1 is in a second logic state H and the second through fourth bits B2, B3, and B4 are in a first logic state L will be described below. Since the first bit B1 is in the second logic state H, a first NMOS transistor N1 is turned on, and a signal output from the first output terminal OUT_1 is at a first voltage level VSS. Since the second through fourth bits B2, B3, and B4 are in the first logic state L, the second through fourth NMOS transistors N2, N3, and N4 are turned off. Since the signal output from the first output terminal OUT_1 is at the first voltage level VSS, the fourth PMOS transistor P201 of the second voltage converter 125_2 is turned on, and a signal output from the second output terminal OUT_2 is at a second voltage level VDD. Also, since the signal output from the first output terminal OUT_1 is at the first voltage level VSS, the seventh PMOS transistor P301 of the third voltage converter 125_3 and the tenth PMOS transistor P401 of the fourth voltage converter 125_4 are turned on, and a signal output from the third output terminal OUT_3 and a signal output from the fourth output terminal OUT_4 are at the second voltage level VDD. Since the signals output from the second through fourth output terminals OUT_2, OUT_3, and OUT_4 are at the second voltage level VDD, the first through third PMOS transistors P101, P102, and P103 are turned off. Thus, the first voltage converter 125_1 is disabled, and the signal output from the first output terminal OUT_1 is maintained at the first voltage level VSS.

As a result, the first transistor TR10 of the decoder 130 is turned on, and the second through fourth transistors TR20, TR30, and TR40 are turned off, and the decoder 130 outputs the first voltage V1 to its output terminal OUT_D.

Next, an example where the second bit B2 is in the second logic state H and the first, third, and fourth bits B1, B3, and B4 are in the first logic state L will be described. In this example, the second NMOS transistor N2 is turned on, and the first, third, and fourth NMOS transistors N1, N3, and N4 are turned off so that the signal output from the second output terminal OUT_2 may be at the first voltage level VSS. Also, since the first, eighth, and eleventh PMOS transistors P101, P302, and P402 are turned on in response to the signal output from the second output terminal OUT_2, the signals output from the first, third, and fourth output terminals OUT_1, OUT3, and OUT4 are at the second voltage level VDD. Since the fourth through sixth PMOS transistors P201, P202, and P203 are turned off in response to the signals output from the first, third, and fourth output terminals OUT_1, OUT_3, and OUT_4, the second voltage converter 125_2 is disabled. Thus, the second transistor TR20 of the decoder 130 is turned on, and the first, third, and fourth transistors TR10, TR30, and TR40 are turned off so that the decoder 130 may output the second voltage V2 to the output terminal OUT_D.

The above-described operation of the semiconductor device 100 of FIG. 2, including the level shifter 120 of FIG. 6 and the decoder 130 of FIG. 7, is performed in a similar manner when only the third bit B3 is in the second logic state H or only the fourth bit B4 is in the second logic state H, and thus, detailed descriptions thereof need not be provided. For example, when the decoder 130 is implemented as illustrated in FIG. 7, the level shifter 120 of FIG. 6 may be used.

Figure 9:
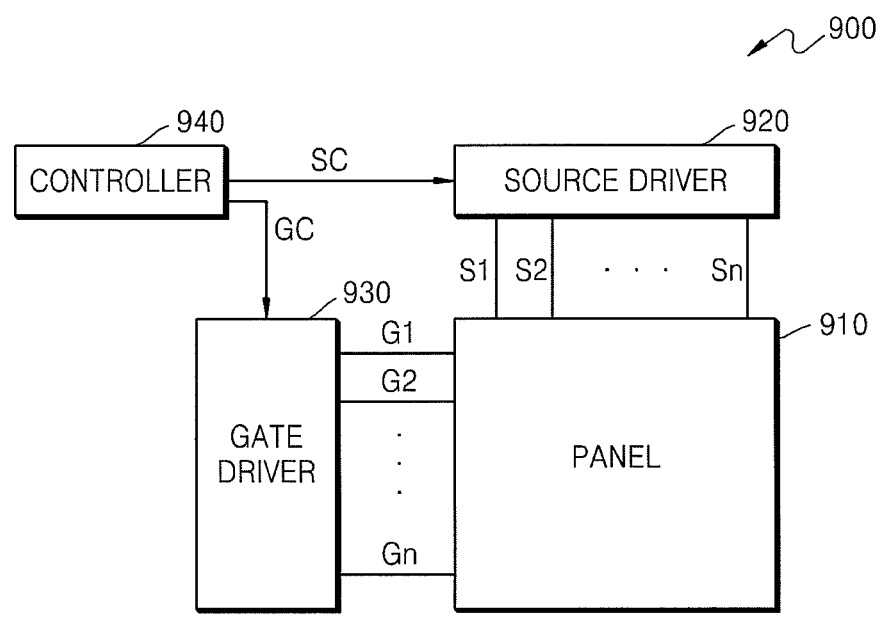
FIG. 9 is a block diagram of a display device including the semiconductor device of FIG. 1, according to an exemplary embodiment of the inventive concept.

FIG. 9 is a block diagram of a display device 900 including the semiconductor device 100 of FIG. 1, according to an exemplary embodiment of the inventive concept. The semiconductor device 100 described above may be used in the display device 900. Referring to FIG. 9, the display device 900 includes a display panel 910, a source driver 920, a gate driver 930, and a controller 940. The display panel 910 includes a plurality of pixel regions, a plurality of gate lines G1 through Gn, and a plurality of source lines S1 through Sn. The plurality of gate lines G1 through Gn may extend in a first direction crossing the plurality of source lines S1 through Sn, which may extend in a second direction different from the first. The crossing gate and source lines may form a matrix.

The controller 940 controls the source driver 920 and the gate driver 930. The controller 940 receives a plurality of control signals (not shown) and a plurality of data signals (not shown). The control signals and the data signals may be provided from an external source (not shown). The controller 940 generates a gate control signal GC and a source control signal SC in response to the received control signals and the received data signals, outputs the gate control signal GC to the gate driver 930, and outputs the source control signal SC to the source driver 920.

The gate driver 930 sequentially supplies gate driver signals to the display panel 910 through gate lines G1 through Gn in response to the gate control signal GC. The source driver 920 supplies a plurality of data voltages (e.g., gray voltages) to the display panel 910 through source lines S1 through Sn in response to the source control signal SC. The data voltages may be supplied by the source driver 920 when the gate lines G1 through Gn are sequentially selected by the gate driver 930.

The source driver 920 may include the semiconductor device 100 described above. For example, the level shifter 120 and the decoder 130 of the semiconductor device 100 of FIG. 1 may be included in the source driver 920. In this example, the first through n-th voltages V1 through Vn illustrated in FIG. 1 may be the gray voltages applied to the source lines S1 through Sn. For example, in the display device 900 of FIG. 9, including the semiconductor device 100, the decoder 130 of the semiconductor device 100 of FIG. 1 may select a gray voltage from among a plurality of gray voltages by using a radix-n level shifter.

While the inventive concept has been particularly shown and described with reference to exemplary embodiments thereof, it will be understood that various changes in form and details may be made therein without departing from the spirit and scope of the disclosure.

What is claimed is:

1. A semiconductor device comprising:
a code generator generating a code comprising one bit that is in a first logic state and at least one bit that is in a second logic state; and
a level shifter outputting signals that are at a first voltage level or at a second voltage level through a plurality of output terminals in response to the code,
wherein the level shifter comprises:
a plurality of voltage controllers, wherein all but one of the voltage controllers control first signals output through all but one of the output terminals to be at the first voltage level in response to the at least one bit; and
a plurality of voltage converters, wherein one of the voltage converters controls a second signal output through the remaining output terminal to be at the second voltage level in response to the first signals.

2. The semiconductor device of claim 1, wherein each of the voltage converters operates complementarily with each of the voltage controllers which uses the output terminal of the level shifter jointly with each of the voltage converters.

3. The semiconductor device of claim 1, wherein the remaining voltage controller disconnects a first voltage source that applies the first voltage level to the remaining output terminal in response to the bit that is in the first logic state, and the all but one voltage controllers outputs the first signals at the first voltage level by connecting the first voltage source to the all but one output terminals in response to the at least one bit that is in the second logic state.

4. The semiconductor device of claim 1, wherein the one voltage converter outputs the second signal that is at the second voltage level by connecting a second voltage source that applies the second voltage level to the remaining output terminal in response to the first signals, and the all but one voltage converters disconnects the second voltage source from the all but one output terminals in response to the second signal.

5. The semiconductor device of claim 1, wherein each of the voltage converters comprises a plurality of transistors each including a gate to which a corresponding first output signal from among the first output signals of the level shifter is applied, wherein the transistors are serially connected to one another between a second voltage source for applying a second voltage level and a corresponding output terminal from among the plurality of output terminals of the level shifter.

6. The semiconductor device of claim 1, wherein each of the voltage converters comprises a plurality of transistors each including a gate to which a corresponding first output signal from among the first output signals of the level shifter is applied, wherein the transistors are connected to one another in parallel between a second voltage source for applying a second voltage level and a corresponding output terminal from among the plurality of output terminals of the level shifter.

7. The semiconductor device of claim 1, further comprising a decoder outputting one voltage from among a plurality of voltages in response to the output signals of the level shifter.

8. The semiconductor device of claim 7, wherein the decoder comprises a plurality of transistors including a gate to which a corresponding output signal from among the output signals of the level shifter is applied, a first terminal to which a corresponding voltage from among the plurality of voltages is applied, and a second terminal connected to an output terminal of the decoder.

9. A display device comprising:
a display panel comprising a plurality of pixel regions;
a source driver comprising:
a code generator generating a code comprising one bit that is in a first logic state and at least one other bit that is in a second and different logic state;
a level shifter including a plurality of output terminals, the level shifter configured to output a second signal at a second voltage level through one of the output terminals and first signals at a first and different voltage level through the other output terminals in response to the code; and
a decoder that outputs one voltage from among a plurality of voltages in response to output signals of the output terminals,
wherein the source driver drives source lines of the display panel in response to the one voltage output from the decoder;
a gate driver driving gate lines of the panel; and
a controller controlling the source driver and the gate driver.

10. The display device of claim 9, wherein the level shifter comprises:
- a plurality of voltage controllers, each receiving a distinct one of the bits of the code, and enabled by the received bit in the second logic state to output the first signals to the other output terminals; and
- a plurality of voltage converters, wherein one of the voltage converters is enabled by the first signals to output the second signal to the one output terminal.

11. The display device of claim 10, wherein one of the voltage controllers receiving the bit in the first logic state is disabled, thereby preventing the voltage controller from applying a signal at the first voltage level to the one output terminal.

12. The semiconductor of claim 10, wherein the other voltage converters are disabled by the second signal, thereby preventing the other voltage converters from applying signals at the second voltage level to the other output terminals.

13. The semiconductor device of claim 10, wherein each of the voltage controllers is connected between a first voltage source providing the first voltage level and a distinct one of the output terminals, wherein a path from the first voltage source through each voltage controller to its corresponding output terminal is disconnected when the corresponding received bit is in the first logic state and connected when the received bit is in the second logic state.

14. The semiconductor device of claim 10, wherein each of the voltage converters is connected between a second voltage source providing the second voltage level and a distinct one of the output terminals, wherein a path from the second voltage source through each voltage converter to its corresponding output terminal is disconnected by the second signal and connected by the first signals.

15. The semiconductor device of claim 10, wherein each of the voltage converters comprises a plurality of transistors each including a gate to which a corresponding one of the first signals and the second signal is applied, wherein the transistors are serially connected to one another between a second voltage source for applying the second voltage level and a corresponding output terminal from among the plurality of output terminals of the level shifter.

16. The semiconductor device of claim 10, wherein each of the voltage converters comprises a plurality of transistors each including a gate to which a corresponding one of the first signals and the second signal is applied, wherein the transistors are connected to one another in parallel between a second voltage source for applying the second voltage level and a corresponding output terminal from among the plurality of output terminals of the level shifter.

17. The semiconductor device of claim 10, wherein the decoder comprises a plurality of transistors including a gate to which a corresponding output signal from among the output terminals of the level shifter is applied, a first terminal to which a corresponding voltage from among the plurality of voltages is applied, and a second terminal connected to an output terminal of the decoder.

18. A method of operating a semiconductor device comprising a level shifter, the method comprising:
- receiving a code comprising one bit that is in a first logic state and at least one bit that is in a second logic state;
- controlling first signals output through all but one of a plurality of output terminals of the level shifter, to be at a first voltage level in response to the bit that is in the second logic state; and
- controlling a second signal output through the remaining output terminal of the level shifter, to be at a second voltage level in response to the bit that is in the first logic state and the first signals.

19. The method of claim 18, wherein controlling the first signals comprises:
- enabling all but one of a plurality of voltage controllers in response to the bit in the second logic state to supply the first signals at the first voltage level to the all but one output terminals; and
- disabling the remaining voltage controller in response to the bit in the first logic state to prevent supply of a signal at the first voltage level to the remaining output terminal.

20. The method of claim 19, wherein controlling the second signal comprises:
- enabling a voltage converter of a plurality of voltage converters in response to the first signals to supply the second signal at the second voltage level to the remaining output terminal; and
- disabling the remaining voltage converters in response to the second signal to prevent supply of signals at the second voltage level to the all but one output terminals.

* * * * *